US006096663A

United States Patent [19]

Alok et al.

[11] Patent Number: 6,096,663

[45] Date of Patent: Aug. 1, 2000

[54] METHOD OF FORMING A LATERALLY-VARYING CHARGE PROFILE IN SILICON CARBIDE SUBSTRATE

[75] Inventors: Dev Alok, Danbury, Conn.; Nikhil Taskar, Ossining; Theodore Letavic, Putnam Valley, both of N.Y.

[73] Assignee: Philips Electronics North America Corporation, New York, N.Y.

[21] Appl. No.: 09/119,282

[22] Filed: Jul. 20, 1998

[51] Int. Cl.[7] .......... H01L 21/265

[52] U.S. Cl. .......... 438/931; 438/518

[58] Field of Search .......... 438/931, 518

[56] References Cited

U.S. PATENT DOCUMENTS

| | | | |
|---|---|---|---|
| 4,897,364 | 1/1990 | Nguyen et al. | 437/69 |
| 5,246,870 | 9/1993 | Merchant | 437/21 |
| 5,300,448 | 4/1994 | Merchant | 437/41 |
| 5,322,802 | 6/1994 | Baliga et al. | 437/22 |
| 5,378,912 | 1/1995 | Pein | 257/335 |
| 5,412,241 | 5/1995 | Merchant | 257/409 |
| 5,422,505 | 6/1995 | Shirai | 257/327 |
| 5,510,281 | 4/1996 | Ghezzo et al. | 437/41 |
| 5,578,506 | 11/1996 | Lin | 437/21 |
| 5,648,671 | 7/1997 | Merchant | 257/347 |
| 5,776,837 | 7/1998 | Palmour | 438/767 |

OTHER PUBLICATIONS

PHA 23,294, U.S. Serial No. 08/959,346, Filed: Oct. 28, 1997.

*Primary Examiner*—David Helms
*Assistant Examiner*—Bradley Smith
*Attorney, Agent, or Firm*—Steven R. Biren

[57] ABSTRACT

A method of forming a laterally-varying charge profile in a silicon carbide substrate includes the steps of forming a silicon nitride layer on a polysilicon layer formed on the silicon carbide substrate, and patterning the silicon nitride layer to provide a plurality of silicon nitrite layer segments which are spaced apart in the lateral direction and which are provided with openings therebetween which are of varying widths. The polysilicon layer is oxidized using the layer segments as an oxidation mask to form a silicon dioxide layer of varying thickness from the polysilicon layer and to form a polysilicon layer portion therebeneath of varying thickness. The silicon dioxide layer and silicon nitride layer segments are removed, and a dopant is ion implanted into the silicon carbide substrate using the polysilicon layer portion of varying thickness as an implantation mask to form a laterally-varying charge profile in the silicon carbide substrate. This method provides an effective and commercially-feasible technique for forming various high-power lateral semiconductor devices, including MOSFET, JFET, diode and IGBT structures, with excellent high-temperature and high-power operating characteristics.

7 Claims, 1 Drawing Sheet

METHOD OF FORMING A LATERALLY-VARYING CHARGE PROFILE IN SILICON CARBIDE SUBSTRATE

BACKGROUND OF THE INVENTION

The invention is in the field of semiconductor processing, and relates more particularly to a method of forming a laterally-varying charge profile in a silicon carbide (SiC) substrate.

In various applications, such as traction control systems in locomotives and the electrical systems in electric vehicles, semiconductor devices which can support high voltages, typically up to 5,000 Volts, and high currents, are desirable. Additionally, such devices should be able to operate at high temperatures and at relatively high frequencies, typically above 150 kHz. Although certain silicon devices, such as thyristors, which can support 5,000 Volts, presently exist, these devices are not able to operate at high temperatures and frequencies due to the inherent limitations of silicon as a semiconductor material.

In order to overcome the drawbacks of silicon, it has been proposed to use silicon carbide in fabricating high-voltage, high-frequency, high-temperature semiconductor devices. Under such operating conditions, unipolar devices are superior to bipolar devices, and lateral unipolar devices are superior to vertical unipolar devices because lateral devices can provide a smaller "on" resistance and therefore lower losses than comparable vertical devices.

It has been found that a particularly advantageous configuration for such silicon carbide devices employs a drift region with a varying doping level in the lateral direction to achieve a significant improvement in operating parameters. Representative devices of this general type are shown in U.S. Pat. No. 5,378,912 and U.S. patent application Ser. No. 08/959,346, filed Oct. 28, 1997, both commonly-assigned with the instant application and incorporated herein by reference.

However, difficulties have been encountered in developing a commercially-feasible method for manufacturing such devices, since techniques appropriate to silicon processing, and in particular to forming laterally-varying charge profiles in semiconductor regions, are not directly transferrable to silicon carbide technology. Thus, for example, the typical silicon technology technique of using lateral diffusion is not applicable to silicon carbide technology, since impurities do not diffuse well in silicon carbide. Typically, the diffusion rate of implanted impurities in silicon carbide is many orders of magnitude lower than in silicon, thus requiring excessive thermal drive times and/or temperatures to form a diffused lateral profile in silicon carbide. In fact, such techniques cannot be accomplished with presently-available standard process furnaces.

Accordingly, it would be desirable to have an effective and commercially-feasible technique for forming a laterally-varying charge profile in a silicon carbide substrate for use in fabricating lateral semiconductor devices of the type described above.

SUMMARY OF THE INVENTION

It is therefore an object of the invention to provide a method of forming a laterally-varying charge profile in a silicon carbide substrate which is both effective and commercially feasible. It is a further object of the invention to provide such a method which does not employ the technique of thermal diffusion to achieve the laterally-varying charge profile.

In accordance with the invention, these objects are achieved in a method of forming a laterally-varying charge profile in a silicon carbide substrate by forming a polysilicon layer on the silicon carbide substrate, forming a silicon nitride layer on the polysilicon layer and patterning the silicon nitride layer to provide a plurality of silicon nitride layer segments which are spaced apart in the lateral direction and which have openings therebetween which are of varying width. The polysilicon layer is oxidized using the silicon nitride layer segments as an oxidation mask to form a silicon dioxide layer of varying thickness from the polysilicon layer, and to form a polysilicon layer portion therebeneath of varying thickness. The silicon dioxide and silicon nitride layer segments are removed, and a dopant is ion implanted into the silicon carbide substrate using the polysilicon layer portion of varying thickness as an implantation mask to form a laterally-varying charge profile in the silicon carbide substrate.

In a preferred embodiment of the invention, a first screen oxide layer is formed directly on the silicon carbide substrate before forming the polysilicon layer, and a second screen oxide layer is formed directly on the polysilicon layer before forming the silicon nitride layer.

In further preferred embodiments of the invention, the thickness of the silicon dioxide layer and the polysilicon layer portion may vary in accordance with either a linear function or a square-root function.

In this manner, the present invention provides a method of forming a laterally-varying charge profile in a silicon carbide substrate which is both effective and commercially feasible.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1A:
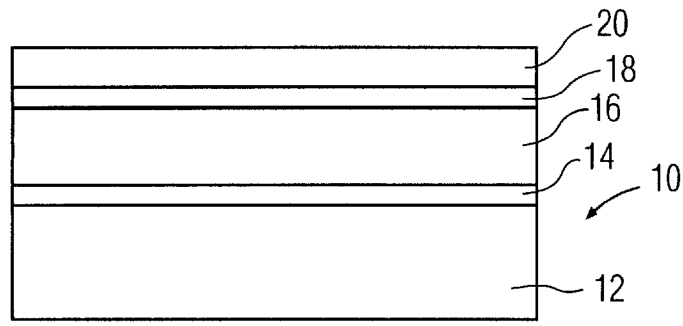
FIGS. 1A–1D show several stages in a method of forming a laterally-varying charge profile in a silicon carbide substrate in accordance with a preferred embodiment of the invention.

In the drawing, it should be noted that the figures are not drawn to scale.

DESCRIPTION OF THE PREFERRED EMBODIMENTS

A preferred embodiment of a method of forming a laterally-varying charge profile in a silicon carbide substrate is shown at four successive points in FIGS. 1A–1D. In FIG. 1A, a semiconductor structure 10 is shown at the point in the process wherein a silicon carbide substrate 12 has been provided with successively with a screen or pad oxide layer 14, a polysilicon layer 16, a further screen or pad oxide layer 18, and a silicon nitride layer 20. It will be recognized that the particular composition and thickness of these various layers may vary within the scope of the invention, but for the purpose of illustration representative but non-limitative values will be provided for an exemplary embodiment.

Thus, for example, the SiC substrate may have a thickness of about 500 microns and may be undoped or be doped with N or P type impurities to a desired level. The screen or pad oxide layers 14 and 18 may typically each be about 600 angstroms of silicon dioxide, and the polysilicon layer 16 may be about one micron thick and doped or undoped. The polysilicon layer can also be deposited in such a manner that amorphous morphology is obtained. Silicon nitride layer 20 may typically be about 1400 angstroms thick. It should be noted that all of the foregoing layers may be formed in manners well-known to those of ordinary skill in the art, and so the manner of provision of these layers will not be described further herein. It should also be noted that, in the general case, the screen or pad oxide layers 14 and 18 are not essential in order to practice the invention, but, as a practical matter, such layers will normally be included for purposes of strain relief, surface protection and the like, as is well-known to those of ordinary skill in the art.

Figure 1B:
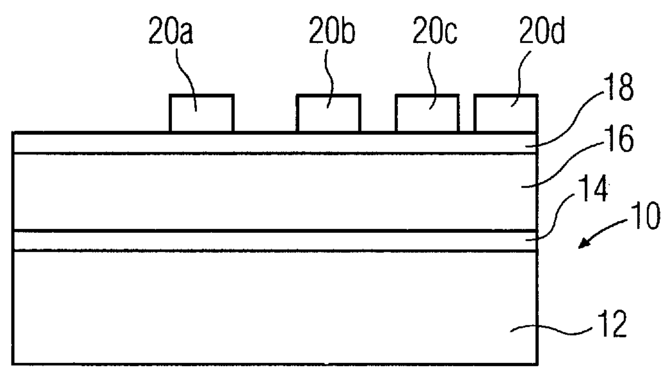

FIG. 1B shows the semiconductor structure 10 at a subsequent stage of manufacture in which the silicon nitride layer 20 has been patterned into a plurality of layer segments 20*a*, 20*b*, 20*c* and 20*d*, which are spaced apart in the lateral direction and which have openings therebetween which are of varying widths. Thus, the opening between layer segments 20*a* and 20*b* is greater than the opening between segments 20*b* and 20*c*, which is in turn greater than the opening between segments 20*c* and 20*d*. It will be recognized that the precise number and spacing of the silicon nitride layer segments will be determined by the desired configuration of the underlying oxidized polysilicon layer to be formed in a later step, that the layer segments may be formed in a conventional manner known to those of ordinary skill in the art, and that the layer segments may be either of substantially equal widths, as shown, or else of different widths.

Figure 1C:
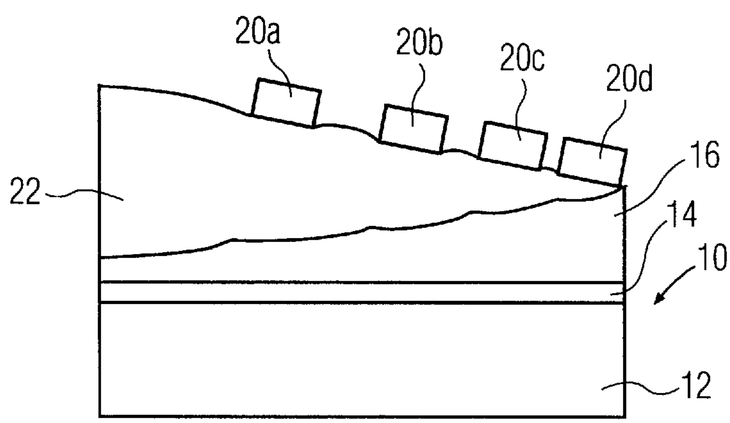

A subsequent step in the process is shown in FIG. 1C, wherein the structure of FIG. 1B has been subjected to an oxidation step, typically a thermal oxidation at a temperature of 1050° C. for about 850 minutes duration. During this oxidizing step, the polysilicon layer 16 is oxidized to form a silicon dioxide layer 22 of varying thickness from the polysilicon layer 16, leaving a polysilicon layer portion 16 therebeneath which is of inversely varying thickness, as shown in FIG. 1C. During the oxidation process, the silicon nitride layer segments 20*a*–20*d* serve as a mask against oxidation, such that the thickness of oxide formed is proportional to the spacing between the masking silicon nitride layer segments. Thus, at the right-hand side of the structure shown in FIG. 1C, where the layer segments are relatively close together, a relatively thin oxide layer is formed and a relatively thick polysilicon layer portion remains. On the contrary, at the left-hand side of this structure, where the silicon nitride layer segments are spaced further apart, silicon dioxide layer 22 is relatively thicker, and the remaining, unoxidized portion of the polysilicon layer 16 is relatively thinner. It will be recognized that, by appropriately spacing the silicon nitride layer segments, the thicknesses of these regions may be effected in different manners, such as in accordance with a linear function or a square-root function.

Figure 1D:
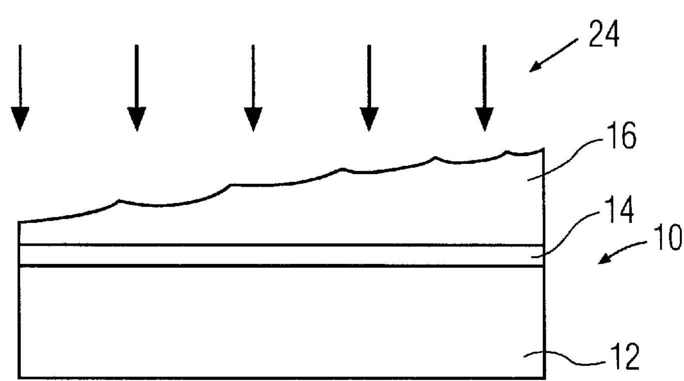

In FIG. 1D, a subsequent step in the process is shown, in which the silicon dioxide layer 22 and the overlying silicon nitride layer segments 20A–20D have been removed either by wet chemical processes (hot phosphoric acid followed by hydrofluoric acid) or by a variety of dry etching processes. For certain applications, such as for very high energy ion implantation processes, a portion of the silicon dioxide layer 22 may be left in place.

The structure of FIG. 1D is then subjected to an ion implantation treatment, symbolically shown by the arrows 24, in order to implant a desired dopant into the silicon carbide substrate 12 using the polysilicon layer portion 16 of varying thickness as an implantation mask to form a laterally-varying charge profile in the silicon carbide substrate. A typical implantation process would result in volume concentrations after implant in the range of $10^{14}$ to $5\times10^{17}$ at /cm$^{-3}$. It will be recognized by those skilled in this art that, in accordance with the nature of the laterally-varying charge profile desired, the implantation dose, as well as the conductivity type of the dopant with respect to that of the substrate, may be selected as desired, and that the implanted dopant may be either of the same conductivity type as that of the substrate, or of opposite conductivity type.

In this manner, the present invention provides a method of forming a laterally-varying charge profile in a silicon carbide substrate which is both effective and commercially feasible. While the invention has been particularly shown and described with reference to several preferred embodiments thereof, it will be understood by those skilled in the art that various changes in form and detail may be made without departing from the spirit or scope of the invention.

What is claimed is:

1. A method of forming a laterally-varying charge profile in a silicon carbide (SiC) substrate, which comprises:

forming a polysilicon layer on said SiC layer substrate;

forming a silicon nitride ($Si_3N_4$) layer on said polysilicon layer;

patterning said $Si_3N_4$ layer to provide a plurality of $Si_3N_4$ layer segments which are spaced apart in the lateral direction and providing said $Si_3N_4$ layer segments with openings therebetween which are of varying widths;

oxidizing said polysilicon layer using said layer segments as an oxidation mask to form a silicon dioxide ($SiO_2$) layer of varying thickness from said polysilicon layer and to form a polysilicon layer portion therebeneath of varying thickness;

removing said $Si_3N_4$ layer segments and at least partially removing said $SiO_2$ layer; and ion implanting a dopant into said SiC substrate using said polysilicon layer portion of varying thickness as an implantation mask to form said laterally-varying charge profile in the SiC substrate.

2. A method of forming a laterally-varying charge profile in a silicon carbide (Sic) substrate as in claim 1, further comprising forming a first screen oxide layer directly on said SiC substrate before forming said polysilicon layer on said SiC substrate, and forming a second screen oxide layer directly on said polysilicon layer before forming said $Si_3N_4$ layer on said polysilicon layer.

3. A method of forming a laterally-varying charge profile in a silicon carbide (SiC) substrate as in claim 1, wherein said substrate is of a first conductivity type and said implanted dopant is of said first conductivity type.

4. A method of forming a laterally-varying charge profile in a silicon carbide (SiC) substrate as in claim 1, wherein said substrate is of a first conductivity type and said implanted dopant is of a second conductivity type opposite to that of said first type.

5. A method of forming a laterally-varying charge profile in a silicon carbide (SiC) substrate as in claim 1, further comprising removing said polysilicon layer portion after ion implanting said dopant into said SiC substrate.

6. A method of forming a laterally-varying charge profile in a silicon carbide (Sic) substrate as in claim 1, wherein the thickness of said $SiO_2$, layer and said polysilicon layer portion vary in accordance with a linear function.

7. A method of forming a laterally-varying charge profile in a silicon carbide (SiC) substrate as in claim 1, wherein the thickness of said $SiO_2$ layer and said polysilicon layer portion vary in accordance with a square-root function.

* * * * *